United States Patent [19]

Yanagida et al.

[11] 4,209,477
[45] Jun. 24, 1980

[54] PROCESS FOR PREPARING A FILM OF DENSELY PACKED STRUCTURE

[75] Inventors: Hiroaki Yanagida, Kashiwa; Masayuki Nagai, Chiba; Tadao Shimizu, Tachikawa, all of Japan

[73] Assignee: Mitsubishi Mining & Cement Co., Ltd., Japan

[21] Appl. No.: 871,609

[22] Filed: Jan. 23, 1978

Related U.S. Application Data

[63] Continuation-in-part of Ser. No. 699,059, Jun. 23, 1976, abandoned.

[30] Foreign Application Priority Data

Aug. 20, 1975 [JP] Japan .................. 50-100898

[51] Int. Cl.² ............................. C04B 35/64
[52] U.S. Cl. ............................ 264/62; 264/63; 264/66; 264/320
[58] Field of Search ............ 264/61, 66, 86, 62, 264/56, 320, 63

[56] References Cited

U.S. PATENT DOCUMENTS

| 3,192,086 | 6/1965 | Gyurk | 264/61 |
| 3,538,571 | 11/1970 | Callahan et al. | 264/61 |
| 3,540,894 | 11/1970 | McIntosh | 264/61 |
| 3,943,994 | 3/1976 | Cleveland | 264/56 |

Primary Examiner—John A. Parrish
Attorney, Agent, or Firm—Philip M. Hinderstein

[57] ABSTRACT

A process for preparing dielectric or semiconductive films which have densely packed structures. In a process comprising spreading a powdery ceramic material suspended in a binder and solvent on to a base plate to form a thin layer and subjecting the layer to firing, the improvement being provisionally firing the thin layer to remove the binder and solvent, cooling the resulting thin layer, covering the thin layer with an organic film, compressing the thin layer and the film to densely pack the thin layer and to adhere the thin layer to the film, prior to the firing.

19 Claims, 4 Drawing Figures

FIG. 2A.
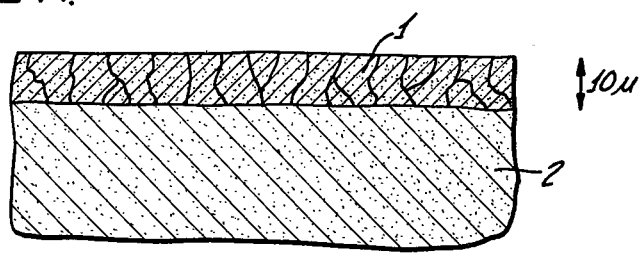
FIG. 2B.
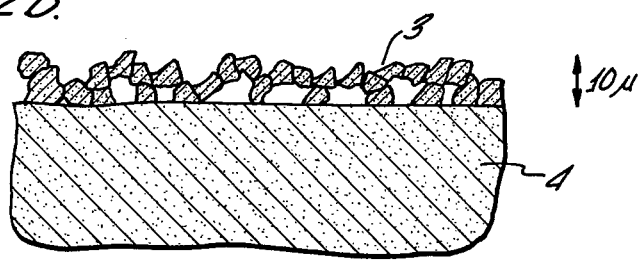
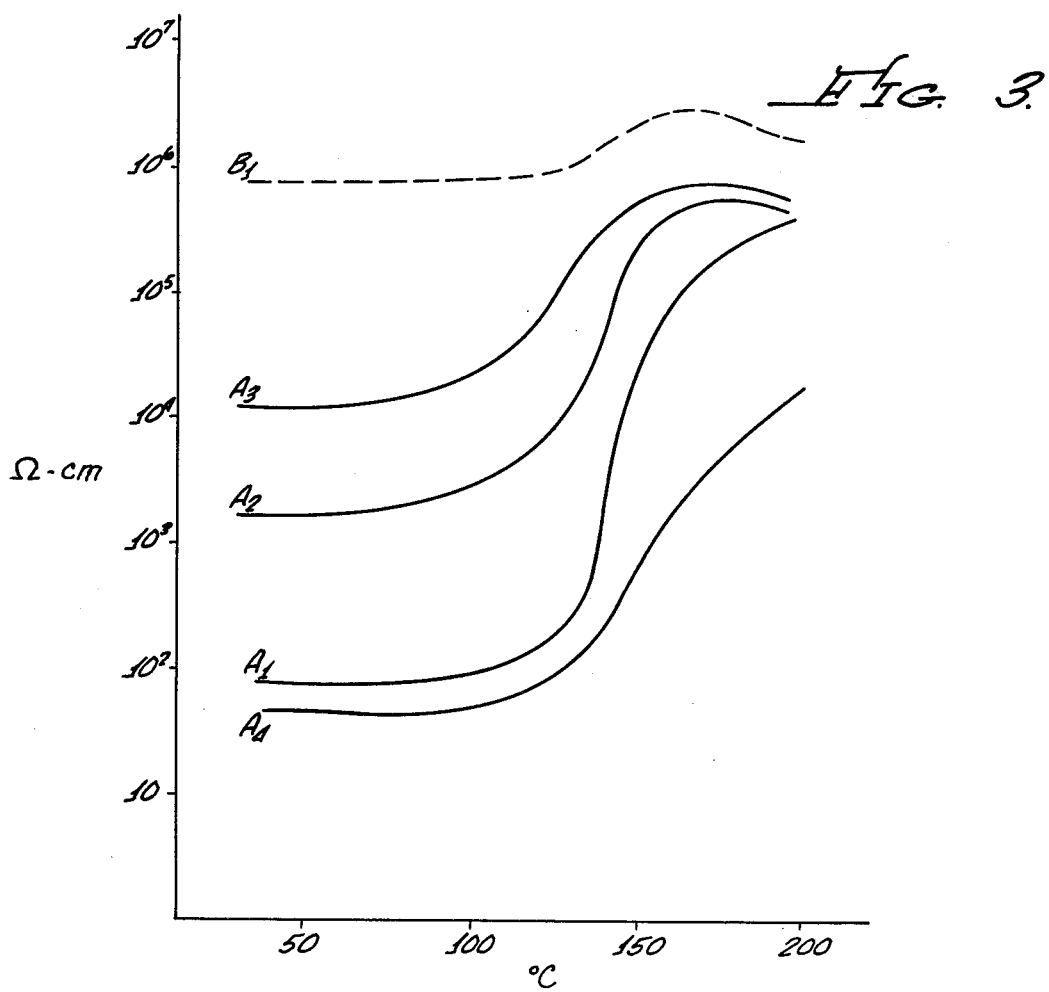
FIG. 3.

PROCESS FOR PREPARING A FILM OF DENSELY PACKED STRUCTURE

This application is a continuation-in-part of Ser. No. 699,059, filed June 23, 1976 now abandoned.

BACKGROUND OF THE INVENTION

The present invention relates to a process for preparing a ceramic film used in components for electronic circuits such as integrated circuits, ceramic filters and the like, and its primary object is to provide a new process for preparing a dielectric or semiconductive film having a densely packed structure from a powdery ceramic material.

Films of dielectric or semiconductive materials such as zinc oxide, titanium oxide, barium titanate, semiconductive barium titanate, alumina and similar materials are used in parts of electronic circuits. One method of preparing these films is by vacuum evaporation or sputtering. Another method, which has the advantage over sputtering of being more economical and more suitable for mass production, is a method of applying a thin film of a mixture of a powdery ceramic and an organic binder in a solvent on to a base place and then firing the mixture to evaporate or burn off the binder and solvent and to sinter the ceramic powder into a thin film. However, films of ceramic materials prepared by this method do not have a densely packed structure. Because they do not have densely packed structures, cracks easily arise therein. Further, since the structures are porous they do not form homogeneous components in which the electrical properties are continuous and/or uniform across the total film surface which gives rise to erratic performances. Additionally when porous films are mated with metal electrode materials, the metal can penetrate the pores of the ceramic which will cause short circuits within the component.

SUMMARY OF THE INVENTION

The primary object of the present invention is to provide a process for preparing a thin film of a ceramic material from powdery ceramic wherein the film has a densely packed, non-porous structure. Further, it is another object of the present invention to provide a process of forming a film from a variety of different kinds of powdery ceramic materials wherein the process is both economical and is also suitable for mass production. Moreover, still an additional object of the present invention is to provide a process for forming a film suitable for use in parts of electronic circuits such as integrated circuits, ceramic filters and the like and for these film so produced to have a densely packed structure such that short circuits caused by electrode metal penetration are prevented.

In accordance with the present invention these and other objects, features and attendant advantages are achieved by providing a process of preparing a densely packed ceramic film from a powdered ceramic wherein the powdered ceramic is mixed with an organic binder dissolved in a solvent until a homogeneous mixture is obtained. This mixture is then spread on a base plate forming a thin layer thereon. The thin layer is provisionally fired to evaporate and decompose the binder and the solvent and is then cooled. The thin layer is covered with an organic film and the sandwich composed of film, thin layer and base plate is compressed to densely pack the thin layer and to adhere it to the organic film. The organic film and thin layer adhering thereto can then be removed from the base plate and can be cut or otherwise shaped if desired. Additionally after cutting or shaping, the thin layer and organic film can be mounted onto an electrode or other electronic part. In any case, the densely packed thin layer adhering to the organic film is heated to sinter the ceramic in to a densely packed film and to evaporate or decompose the organic film.

These advantages and objects and others of the present invention will be apparent to those skilled in the art upon consideration of the following detailed description of the preferred embodiments thereof with reference being had to the accompanying drawings.

BRIEF DESCRIPTION OF THE DRAWINGS

FIGS. 2 (A) and 2 (B) are sketches illustrating a microscopic cross sectional view of a film formed by firing, FIG. 2 (A) shows a film resulting from the process of the present invention and FIG. 2 (B) shows a film resulting from a prior art process; and FIG. 3 is a series of waveforms showing the electronic properties of films, waveform $A_1$ through $A_4$ being samples resulting from the process of the present invention and waveform B, being from a sample of film prepared by a prior art process.

In FIG. 1 the process according to the preferred embodiment of the present invention is shown. The steps of the process which are shown in double lines are the improved parts of the present invention over the prior art. Thus a neat powdery ceramic material or a blend of the several components of a heterogeneous mixture of powdery ceramic materials are screened or otherwise adjusted to a uniform particle size range. An organic binder dissolved in a suitable solvent is added and after thoroughly mixing and kneading the ceramic phase and the binder-solvent phase together the resulting homogeneous mixture is spread, using any one of several known techniques, onto a base plate or other suitable support which has a flat surface.

Figure 1:
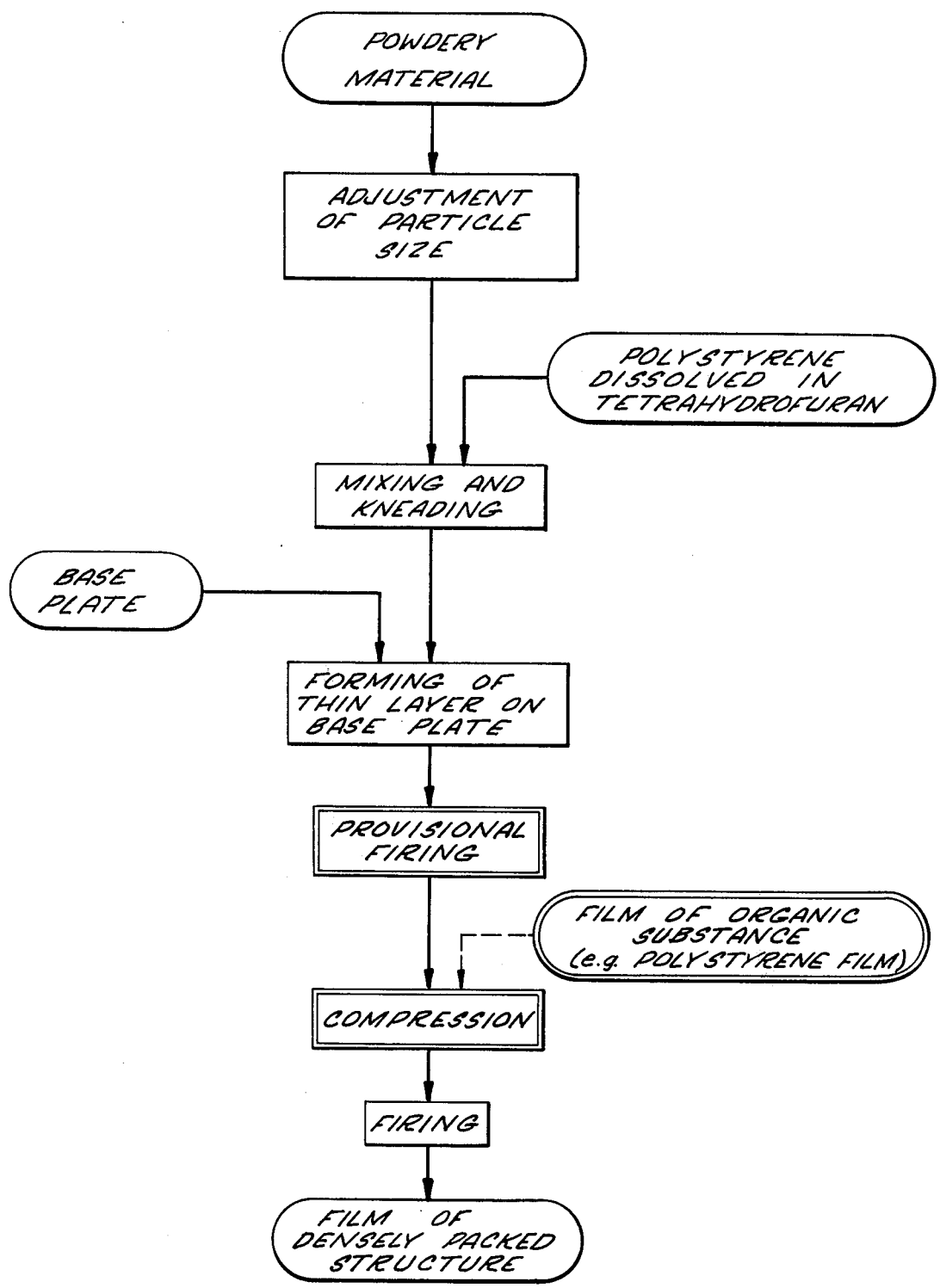
FIG. 1 is a flow diagram showing the process of the present invention wherein the improvements are shown in double lines.

Because the powdery ceramic material is homogeneously suspended in the binder-solvent phase, it is possible to very carefully control the thickness of the resulting layer of ceramic. Thus by adjusting the amount of this homogeneous mixture applied to the base plate, a variety of and a very reproducible range of thickness of the ceramic layer can be achieved.

In the present improved process this layer of ceramic suspended in binder-solvent is now subjected to a provisional firing at a temperature sufficient to remove the binder-solvent from the ceramic by evaporation and/or decomposition leaving a uniform layer of ceramic on the base plate. The resulting ceramic layer is allowed to cool and an organic film is placed over it, sandwiching the ceramic between the organic film and the base plate. This sandwich is then subjected to compression by mechanical pressure with a press or with some other suitable compression method. After the sandwich has been compressed to densely pack the ceramic layer, it is removed from the press. During the compression step and because of the pressure applied, the ceramic layer adheres to the organic film allowing the intact composite layer of organic film plus densely packed ceramic layer to be peeled away from the base plate, if desired.

The resulting layer of ceramic-organic film can be cut into intricate shapes corresponding to the shape the final ceramic layer will have in an electronic component. Thus if the ceramic is to be bonded to an electrode, it can be scissored, cut or punched into the exact shape desired. The ceramic-organic film, either neat or mounted onto an electrode or other part of an electronic component, is then subjected to final firing producing the desired finished ceramic component.

Refering now to FIGS. 2 (A) and 2 (B), there are shown two sketches, each illustrating a microscopic cross sectional view of a film formed on a base plate. FIG. 2 (A) illustrates a view of a film formed by the present process wherein the principal parts of the present process where excluded, ie., those steps shown in double lines in FIG. 1. In these figures, integers 1 and 3 and 2 and 4, respectively, show a film layer of a ceramic material and an electrode. As is seen from a comparison of FIGS. 2 (A) and 2 (B), a film resulting from the present process has a more densely packed structure, is continuous across the surface of the electrode and does not contain any voids which could cause cracking or short circuits from electrode metal penetration.

The present process is useful to form ceramic films of dielectric or semiconductive materials such as zinc oxide, titanium oxide, barium titanate, semiconductive barium titanate, alumina, titanic oxide, nickel oxide, and other ceramics known in the electronics arts.

The organic binder can be choosen from any one of a number of suitable substances, the criteria for selection being, a) it must be either an aqueous or organically soluble binder or b) it must be a wax like substance which will liquify at a reasonable temperature and upon cooling will set up to be a solid or semisolid; however, in either case it must be possible to homogeneously disperse the ceramic powder therein and both the a and b group of substances must have reasonable temperatures wherein they decompose and/or evaporate. Suitable as binders are cellulose resins, polyvinyl alcohol resins, polyacrylate resins, polyacrylamide resins, polyvinylacetate, polystyrene and methylcellulose. Preferred as binders are polystyrene and methylcellulose. The solvent chosen, whether it be aqueous or organic will of course be dependent on the binder used; the criterion being, the binder must be soluble in the solvent. Thus the solvent will be chosen by the art skilled based upon knowledge of the properties of the binder. Typically solvents will be chosen from the group consisting of water, acetone, tetrahydrofuran, dioxane, lower ketones, lower alcohols, cellosolves, dimethylforamide, halocarbons, aromatics such as benzene and the like. When polystyrene is used as the binder, tetrahydrofuran makes a suitable solvent and when methylcellulose is used as the binder, water makes a suitable solvent.

After spreading onto a base plate, which may be any inert material such as ceramics, glass, metal and the like, the powdery ceramic-binder solvent mixture is allowed to air dry to remove excess solvent, if necessary, and it is then provisionally fired at from about 300 to about 900° C. for about 0.5 to about 10 hours. The provisional firing time and temperature being dependent on the binder and solvent used. The lower temperature limit being the lowest temperature at which the binder and solvent will be completely decomposed and/or evaporate, the upper temperature limit being the temperature at which the powdery ceramic starts to irreversibly react with and adhere to the base plate. The time for provisional firing is dependent upon the temperature. The lower the temperature the longer the time necessary for complete decomposition and/or evaporation and the higher the temperature, the shorter the time necessary. The time and temperature must be adjusted within the knowledge of the art skilled for each binder-solvent combination used. It being important that the binder and solvent do not evaporate so fast that they explode from the surface of the powdery ceramic which could cause this surface to become distorted. Generally the most preferred time and temperature conditions are about 600° C. for approximately 1 hour in an atmosphere of dry air.

After provisionally firing, the ceramic is allowed to cool to a temperature wherein when the organic film is applied to the surface of the ceramic, it will not melt or otherwise react. Depending on the organic film used this will generally be in the range of from about 0° to about 300° C. Generally cooling is accomplished simply by letting the provisionally fired ceramic stand at room-temperature for several minutes, until it has been cooled sufficiently to be used for the next step.

In most cases the same materials used for the binders can be preformed into films and can be used as the organic film in the compression step. Also useful as the organic film are polyethylene and polyflurocarbons such as Teflon ®. Preferable the film is either a polystyrene film or a methylcellulose film. Preferable thickness of the film is from about 10 to about 200 microns.

After the film is placed on the ceramic, the film-ceramicbase plate sandwich is compressed to a final pressure of from about 0.5 to about 10,000 Kg/cm$^2$. A more preferred range is from 500 to about 1,000 Km/cm$^2$. During this compression, the temperature must be maintained below that which will decompose or evaporate the organic film. Generally the compression will be done below 300° C., most preferably near room temperature, from 0° to 30° C.

If desired, the densely packed ceramic-orgainc film can now be peeled, stripped or otherwise removed from the base plate and can now be committed to any shape. In any case, the ceramic powder is now sintered together by heating or firing at from about 1000° to about 1600° C. for from about 0.5 to about 168 hours. Preferably from about 1200° to about 1400° C. for approximately 1 hour. Advantage can be taken of the temperature necessary for sintering to bond the ceramic to some other surface, that is the densely packed powdered ceramic-organic film layer can be mounted on to an electrode or other part prior to sintering, and during sintering, a permanent bond between the two is formed. Because the ceramic powder is densely packed before this bond is formed, there are no voids in the ceramic wherein metal from the electrode can flow into and cause a short, rendering the component defective.

EXAMPLE 1

A semiconductor of semiconductive barium titanate was prepared by thoroughly mixing powdered portions of barium titanium oxalate, antimony hydroxide, titanium dioxide and silicone dioxide using a conventional mixing technique and the mixture was then sized. Typically this mixture contains the following amounts of the ingredients in mol ratio:
 100 mol of barium titanium oxalate,
 0.15 mol of antimony hydroxide,
 0.87 mol of titanium dioxide,
 2.62 mol of silicone dioxide.

5 gms of this mixture was added to a premixed 35 gm portion of binder in solvent which consists of 7 gms of polystyrene in 29 gms of tetrahydrofuran (THF). The ceramic powder was thoroughly mixed with the polystyrene-THF and the resulting mixture was spread out on a base plate of glass using a doctor blade to form a homogeneous layer having a thickness of approximately 80 microns. The polystyrene and THF were removed from the ceramic by provisionally firing at 600° C. for 1 hour and the ceramic layer was then air cooled to approximately room temperature. A film of polystyrene 100 microns thick was placed on the top of the ceramic and the resulting sandwich was then pressed in a mechanical press to a final pressure of 1000 Kg/cm². After cutting to shape, pieces of the layer of ceramic adhering to polystyrene film were placed on the surface of electrodes and were fired at 1200° to 1400° C. for 1 hour and then cooled. The resulting products were electrodes having a densely packed film of semiconductive barium titanate adhering to its surface.

The electronic characteristics of films formed as per example 1 are shown in FIG. 3. In this figure, the ordinate indicated the logarithmic value of specific resistance (ohm-centimeter) and the temperature is indicated as the abscissa. Samples resulting in waveforms $A_1$ and $A_4$ were prepared as per example 1, differing from each other in their shapes and firing conditions. A sample resulting in waveform $B_1$ was prepared according to a process wherein the principal parts (double lines in FIG. 1) of the present process were excluded. Samples resulting in waveforms $A_1$ to $A_4$ possess excellent characteristics for temperature limiting elements in an electronic circuit.

EXAMPLE 2

Following the same procedure as outlined in example 1, various other kinds of ceramics can be used to form electronis components. Ceramics such as titanium oxide, barium titanate and alumina may be made into films having a densely packed structure which could be employed as excellent condensers, a varister could be formed from a film of zinc oxide as the ceramic. Other types of integrated circuits can also be economically manufactured.

In cases where the base electrode has a simple shape or is to be covered by a layer of powdery material all over its surface, the provisional firing, compression and firing steps may be successively carried out after spreading the material on the electrode surface without removing the densely packed ceramic-organic film layer from the surface of the electrode for cutting, shaping, etc.

As compared with a standard thickness (approximately 10 microns) shown in FIGS. 2(A) and 2(B), the film formed by the present invention can also be formed in other thicknesses. To do this one could use large particle sizes, different thickness of the powered ceramic-binder solvent layer or it is also possible to obtain a thicker film by repeating certain steps of the process. The steps of the process are carried out as before described up to and including the compression step. At this point the densely packed ceramic layer adhering to the organic film is not removed from the first base plate but serves, itself, as the base plate for the next cycle wherein the spreading, provisional firing, covering and compression steps are repeated. This can be repeated until the desired thickness of the layer is achieved. The final layer made up of the composite of each individual layer can be removed from the first base plate for shaping and firing or it can be fired on the first base plate. Either way, the final composite layer is fired to sinter the ceramic and to evaporate and/or decompose the organic films.

The advantages which result from the present process can be enumerated as follows: A film is manufactured more easily than those formed by vacuum evaporation or sputtering. The material is easily handled since it is in a powdered form. The present process is applicable to a wide variety of materials. The thickness of the layer is easily controlled. Because after provisionally firing and compression, the ceramic is adhering to an organic film, the shape may be easily regulated. This allows the manufacturer of electronic parts having accurate and reproducible dimensions. Because of the densely packed structure, the electronic characteristics of the film show an ideal value. For the same reason, short circuiting caused by penetration of the electrode material is effectively prevented.

While we have shown and described in considerable detail what we believe to be the preferred form of our invention, it will be understoody by those skilled in the art that the invention is not limited to such details, but may take various other forms within the scope of the claims.

We claim:

1. A process of preparing a densely packed ceramic film from a powdered ceramic which comprises:
    mixing the powdered ceramic with an organic binder dissolved in a solvent to form a homogenous mixture;
    spreading the homogenous mixture on to a base plate to form a thin layer of said mixture on said base plate;
    provisionally firing said thin layer of said mixture at from about 300° to about 900° C. to remove by evaporation and decomposition said organic binder and said solvent from said thin layer;
    cooling the provisionally fired thin layer;
    covering said provisionally fired thin layer with an organic film to form a sandwich wherein said provisionally fired thin layer is between said organic film and said base plate;
    compressing said sandwich of film, thin layer and base plate at a pressure of about 0.5 to about 10,000 Kg/cm² to densely pack the thin layer and to adhere said densely packed thin layer to said organic film; and
    heating said densely packed thin layer adhering to said film at from about 1000° to about 1600° C. to sinter said densely packed thin layer and to remove said organic film by evaporation and decomposition.

2. The process of claim 1 wherein the densely packed thin layer adhering to the organic film is separated from the base plate prior to sintering.

3. The process of claim 2 wherein the densely packed thin layer adhering to the organic film is cut to a final shape prior to sintering.

4. The process of claim 1 wherein the organic binder is selected from the group consisting of polyvinyl alcohol, polyacrylate, polystyrene or methylcellulose.

5. The process of claim 4 wherein the organic binder is selected from polystyrene or methylcellulose.

6. The process of claim 1 wherein the organic film is selected from a film of the group consisting of polyvinyl alcohol, polyacrylate, polystyrene, methylcellulose, polyethylene or polyfluoro carbons.

7. The process of claim 6 wherein the organic film is a film selected from polystyrene or methylcellulose.

8. The process of claim 7 wherein the solvent is chosen from tetrahydrofuran or water.

9. The process of claim 1 wherein said provisional firing is for about 0.5 to about 10 hours.

10. The process of claim 1 wherein said provisional firing is at a temperature of about 600° C.

11. The process of claim 9 wherein said provisional firing is at a temperature of about 600° C. for about one hour.

12. The process of claim 1 wherein said sintering is at a temperature of about 1200° to about 1400° C.

13. The process of claim 1 wherein said sintering is for about 0.5 to about 168 hours.

14. The process of claim 1 wherein said compression is at a pressure of about 500 to about 1,000 Kg/cm$^2$.

15. The process of claim 1 wherein said covering and compression steps are repeated at least once.

16. The process of claim 15 wherein the composite layer is separated from the first base plate prior to sintering.

17. The process of claim 16 wherein th composite layer is cut to a final shape prior to sintering.

18. The process of claim 3 wherein the shaped densely packed thin layer adhering to the organic film is mounted onto a portion of an electronic component prior to sintering.

19. In the process of preparing ceramic films wherein a powdery ceramic material suspended in a binder and solvent is spread in a thin layer onto a base plate and then fired the improvement comprising:

provisionally firing the thin layer at from about 300° to 900° C. to remove by evaporation and decomposition the binder and the solvent from the thin layer;

cooling the provisionally fired thin layer;

covering said provisionally fired thin layer with an organic film to form a sandwich wherein said provisionally fired thin layer is between said organic film and the base plate;

compressing said sandwich of film, thin layer and base plate at a pressure of about 0.5 to about 10,000 Kgcm$^2$ to densely pack the thin layer and to adhere the densely packed thin layer to said organic film;

firing said densely packed thin layer adhering to said film at from about 1000° to about 1600° C. to remove said organic film by evaporation and decomposition.

* * * * *